(12) United States Patent
Shannon et al.

(10) Patent No.: US 12,034,442 B2
(45) Date of Patent: Jul. 9, 2024

(54) CONFIGURABLE GROUND SWITCH TO SUPPORT POWER DELIVERY BETWEEN TWO SUPPLY DOMAINS

(71) Applicant: Cirrus Logic International Semiconductor Ltd., Edinburgh (GB)

(72) Inventors: Donelson A. Shannon, Austin, TX (US); Jianping Wen, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 113 days.

(21) Appl. No.: 17/948,442

(22) Filed: Sep. 20, 2022

(65) Prior Publication Data

US 2024/0097683 A1 Mar. 21, 2024

(51) Int. Cl.
*G11C 5/14* (2006.01)
*G11C 17/00* (2006.01)
*H03K 19/0185* (2006.01)

(52) U.S. Cl.
CPC ....... *H03K 19/018507* (2013.01); *G11C 5/14* (2013.01); *G11C 17/00* (2013.01)

(58) Field of Classification Search
CPC ... G11C 5/14; G11C 17/00; H03K 19/018507
See application file for complete search history.

(56) References Cited

U.S. PATENT DOCUMENTS

| 4,232,271 | A  | * | 11/1980 | Dobkin ........... | H03F 3/45479 330/261 |
|---|---|---|---|---|---|
| 11,152,046 | B1 | * | 10/2021 | Raszka ........... | G11C 11/413 |
| 2001/0004225 | A1 | * | 6/2001 | Nicholls ......... | H03B 5/1805 331/34 |
| 2006/0267629 | A1 | * | 11/2006 | Bhattacharya .... | H03K 19/0016 326/33 |
| 2016/0225758 | A1 | * | 8/2016 | Lai ................ | H01L 27/0251 |
| 2017/0070225 | A1 | * | 3/2017 | Kim ............... | H03K 19/0016 |
| 2020/0295760 | A1 | * | 9/2020 | Zhou .............. | H03K 19/018507 |
| 2021/0241824 | A1 | * | 8/2021 | Fujiwara ......... | G11C 11/412 |

* cited by examiner

*Primary Examiner* — Khamdan N. Alrobaie
(74) *Attorney, Agent, or Firm* — Jackson Walker L.L.P.

(57) ABSTRACT

A system may include a first power domain defined by a first supply rail and a first ground rail, a second power domain defined by a second supply rail and a second ground rail, and a configurable switch coupled between the first ground rail and the second ground rail such that when the configurable switch is enabled, the first ground rail and the second ground rail are electrically shorted to one another and when the configurable switch is disabled, the first ground rail and the second ground rail are electrically isolated from one another.

22 Claims, 2 Drawing Sheets

CONFIGURABLE GROUND SWITCH TO SUPPORT POWER DELIVERY BETWEEN TWO SUPPLY DOMAINS

FIELD OF DISCLOSURE

The present disclosure relates in general to methods and systems for operating a configurable switch between ground voltages of two different power domains in order to support power delivery between the two power domains.

BACKGROUND

In some instances, it may be desirable to operate a circuit or system from two different power domains, each having its own supply rail (e.g., at voltages VDD1 and VDD2) and each having its own ground rail (e.g., at voltages GND1 and GND2). Each power domain may have a decoupling capacitor between its respective supply rail and ground rail, in order to enable effective power supply regulation.

In a first mode of operation, the power domains may remain isolated, with ground rails GND1 and GND2 kept isolated in order to avoid capacitive coupling (e.g., "crosstalk") between the power domains. In a second mode, power may be supplied from a supply rail (e.g., VDD1) on one power domain to circuits coupled to the ground rail (e.g., GND2) on the other power domain. However, in such second mode, the absence of a decoupling capacitor between the supply rail of the first power domain and the ground rail of the second power domain may cause poor power supply regulation. Further, implementing such a decoupling capacitor between the supply rail of the first power domain and the ground rail of the second power domain may lead to highly undesirable capacitive coupling (e.g., crosstalk) between the power domains when operating in the first mode.

SUMMARY

In accordance with the teachings of the present disclosure, the disadvantages and problems associated with maintaining two power domains in which power delivery is sometimes desired between the two power domains may be reduced or eliminated.

In accordance with embodiments of the present disclosure, a system may include a first power domain defined by a first supply rail and a first ground rail, a second power domain defined by a second supply rail and a second ground rail, and a configurable switch coupled between the first ground rail and the second ground rail such that when the configurable switch is enabled, the first ground rail and the second ground rail are electrically shorted to one another and when the configurable switch is disabled, the first ground rail and the second ground rail are electrically isolated from one another.

In accordance with these and other embodiments of the present disclosure, a method may be used in a system having a first power domain defined by a first supply rail and a first ground rail and a second power domain defined by a second supply rail and a second ground rail. The method may include in a first mode, disabling a configurable switch coupled between the first ground rail and the second ground rail in order to electrically isolate the first ground rail and the second ground rail from one another. The method may also include in a second mode, enabling the configurable switch in order to electrically short the first ground rail and the second ground rail to one another.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Figure 1:
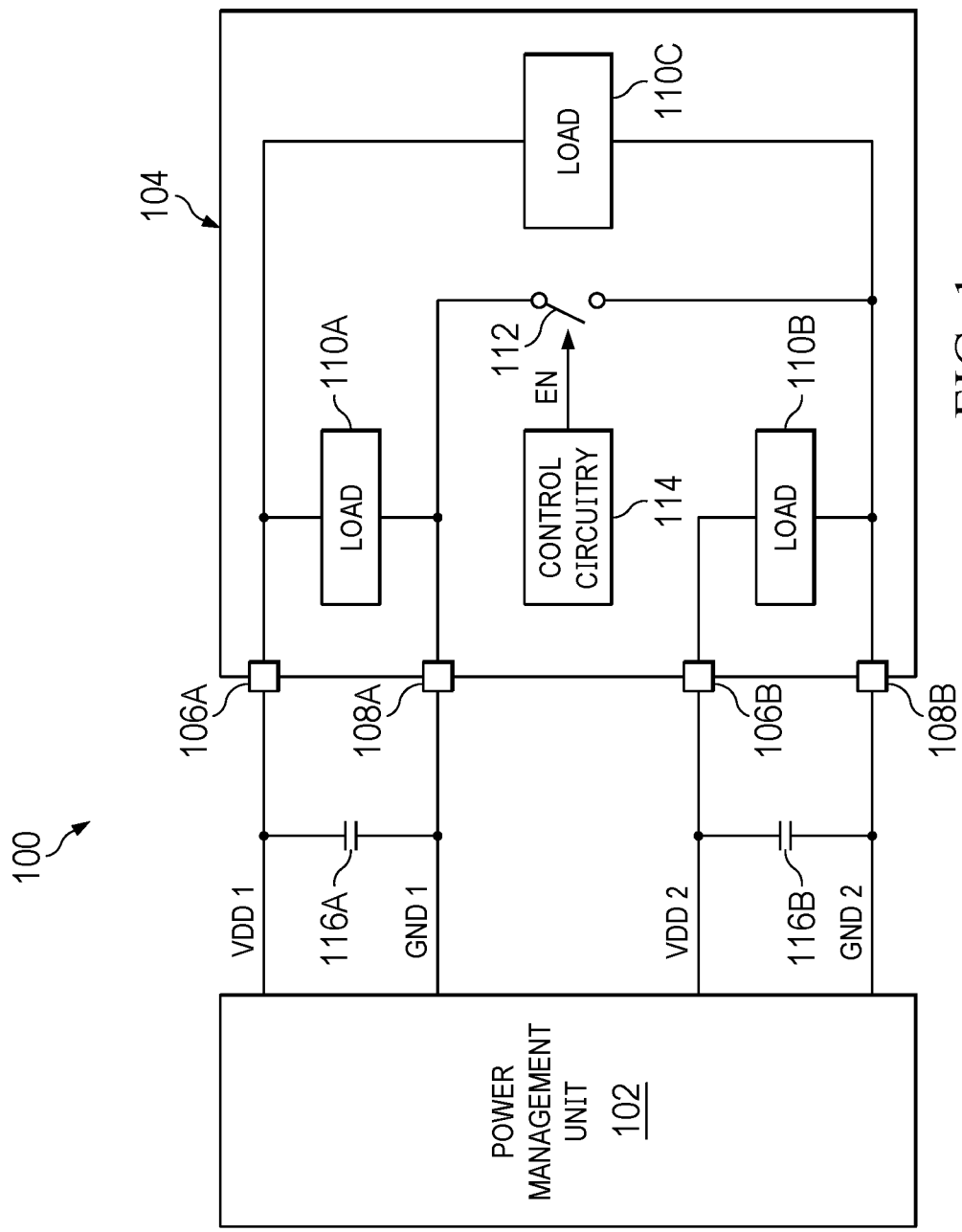
FIG. 1 illustrates an example system comprising an integrated circuit supplied with two different power domains from a power management unit, in accordance with embodiments of the present disclosure.

FIG. 1 illustrates an example system 100 comprising an integrated circuit 104 supplied with two different power domains from a power management unit 102, in accordance with embodiments of the present disclosure.

Power management unit 102 may include any suitable system, device, or apparatus configured to generate a plurality of power domains for use in supplying electrical energy to electrical and electronic components, including without limitation, integrated circuit 104. For example, as shown in FIG. 1, power management unit 102 may generate a first power domain defined by supply rail VDD1 and ground rail GND1 and a second power domain defined by supply rail VDD2 and ground rail GND2. In some embodiments, rail voltages VDD1 and VDD2 may be different (e.g., VDD1>VDD2).

Integrated circuit 104 may include any system, device, or apparatus including a semiconductor die with any suitable arrangement of circuit components formed thereon, in order to carry out desired functionality. As shown in FIG. 1, integrated circuit 104 may receive supply rail VDD1 via a pin 106A, supply rail VDD2 via a pin 106B, ground rail GND1 via a pin 108A, and ground rail GND2 via a pin 108B. Such rail voltages may be transmitted from power management unit 102 to integrated circuit 104 via a power bus, which may be implemented by a ribbon cable, printed circuit board traces, or in any other suitable manner.

For purposes of clarity and exposition, integrated circuit 104 is depicted having only four pins: 106A, 106B, 108A, and 108B. However, it is understood that integrated circuit 104 may include any other suitable number and arrangement of pins for receiving other power rails, other ground rails, and/or electronic signals.

Further, a first decoupling capacitor 116A may be coupled between supply rail VDD1 and ground rail GND1 to facilitate regulation of the voltage of the first power domain and a second decoupling capacitor 116B may be coupled between supply rail VDD2 and ground rail GND2 to facilitate regulation of the voltage of the second power domain. Accordingly, supply rail VDD1 may have a lower-impedance path to ground rail GND1 as compared to ground rail GND2.

As also shown in FIG. 1, a first load 110A comprising one or more electrical and/or electronic components may be powered from the first power domain and thus may be coupled between supply rail VDD1 and ground rail GND1, and a second load 110B comprising one or more electrical and/or electronic components may be powered from the second power domain and thus may be coupled between supply rail VDD2 and ground rail GND2. Further, in at least one mode of operation, a third load 110C comprising one or more electrical and/or electronic components may be powered from supply rail VDD1 but may be coupled to ground rail GND2. Although not shown in FIG. 1, such third load 110C may in some modes be powered from the second power domain, but in other modes may be powered from supply rail VDD1 but may still use ground rail GND2 as a return path.

A configurable switch 112 may be coupled between ground rail GND1 and ground rail GND2. In some embodiments, configurable switch 112 may be implemented with a transistor (e.g., n-type field-effect transistor). Configurable switch 112 may be selectively enabled (e.g., closed, activated, turned on) and disabled (e.g., open, deactivated, turned off) in response to an enable signal EN generated by control circuitry 114. Although control circuitry 114 is shown in FIG. 1 as internal to integrated circuit 104, in some embodiments, control circuit 114 may be external to integrated circuit 104.

Integrated circuit 104 may operate in a plurality of modes including at least a first mode and a second mode. In the first mode, control circuitry 114 may disable switch 112, and the first power domain and the second power domain may be isolated in order to minimize coupling (e.g., crosstalk) between the power domains. In the first mode, the first power domain may deliver electrical energy to load 110A, the second power domain may deliver electrical energy to load 110B, with no power delivery to load 110C from supply rail VDD1.

In the second mode, supply rail VDD1 may deliver electrical energy to load 110C with a return path through ground rail GND2. In addition, control circuitry 114 may enable switch 112, thus electrically shorting ground rail GND1 to ground rail GND2 and providing a return path through ground rail GND1 in addition to ground rail GND2. As a result, decoupling capacitor 116A coupled between supply rail VDD1 and ground rail GND1 may be effective during the second mode to create a low-impedance path from supply rail VDD1 to ground rail GND2. In particular, ground rail GND1 may provide a return path for high-frequency current components flowing through load 110C.

In other words, when switch 112 is enabled, impedance between supply rail VDD1 and ground rail GND2 may be overdamped, while when switch 112 is disabled, impedance between supply rail VDD1 and ground rail GND2 may be underdamped.

Figure 2:
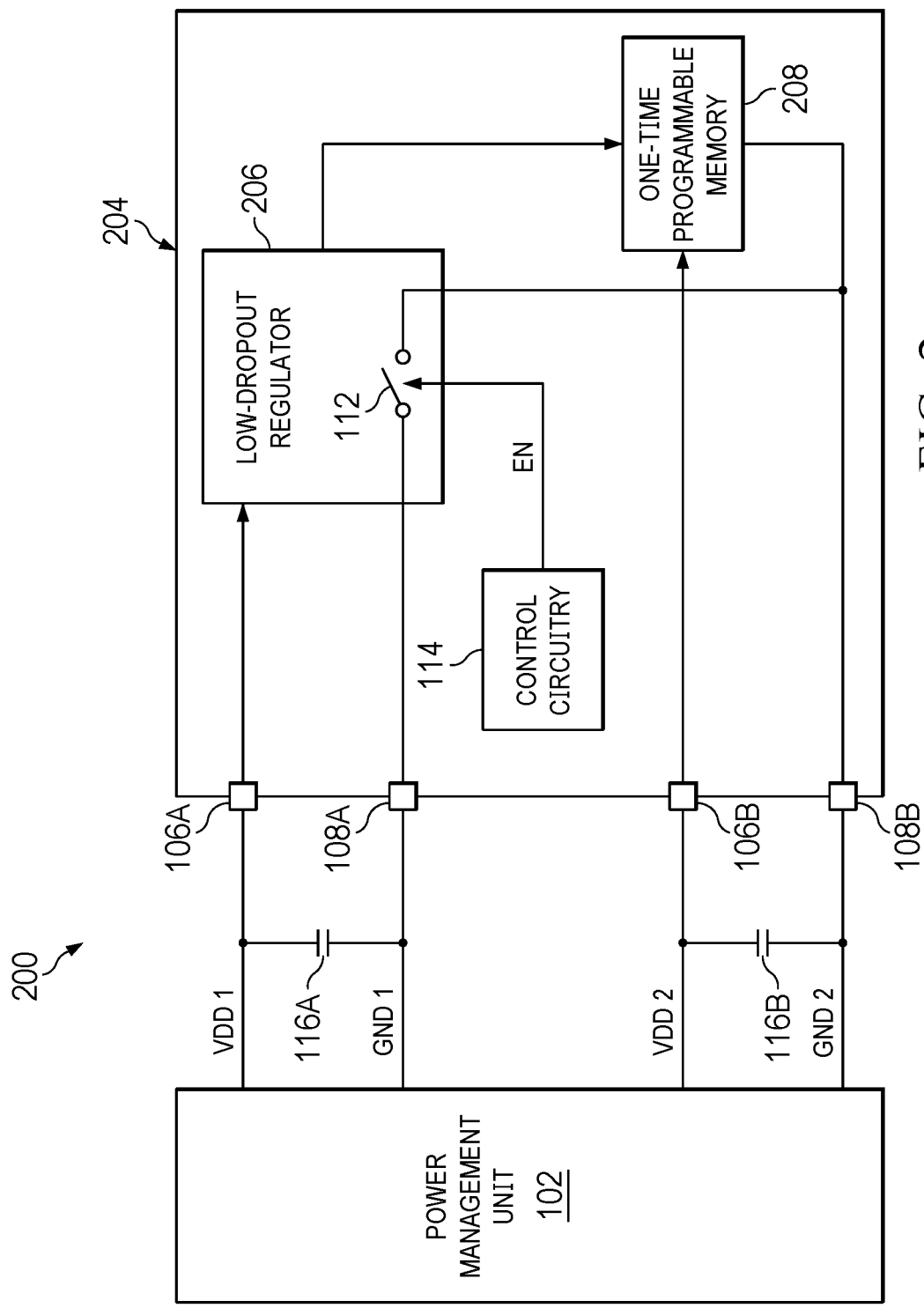
FIG. 2 illustrates an example system comprising an integrated circuit having a one-time programmable memory, the integrated circuit supplied with two different power domains from a power management unit, in accordance with embodiments of the present disclosure.

FIG. 2 illustrates an example system 200 comprising an integrated circuit 204 having a one-time programmable memory 208. Integrated circuit 204 may be supplied with two different power domains from power management unit 102, in accordance with embodiments of the present disclosure. System 200 shown in FIG. 2 may be similar in many respects to system 100 of FIG. 1. Accordingly, only certain differences between system 100 and system 200 are described below.

In particular, system 200 may include integrated circuit 204 in lieu of integrated circuit 104. As shown in FIG. 2, integrated circuit 204 may include a low-dropout regulator 206 and a one-time programmable memory 208. In a first mode of operation, one-time programmable memory 208 may be powered from the second power domain (e.g., supply rail VDD2 and ground rail GND2). The first mode of operation may be one in which the second power domain supplies electrical energy to one-time programmable memory 208 in order to enable data to be read from one-time programmable memory 208.

In a second mode of operation, one-time programmable memory 208 may be powered from low-dropout regulator 206, which may be configured to regulate voltage VDD1 of the first power domain at a voltage higher than voltage VDD2. The second mode of operation may be one in which the first power domain supplies electrical energy to one-time programmable memory 208 in order to enable data to be written to one-time programmable memory 208. As in system 100, control circuitry 114 of integrated circuit 204 may enable switch 112 (which may be integral to low-dropout regulator 206), thus electrically shorting ground rail GND1 to ground rail GND2 and providing a return path through ground rail GND1 in addition to ground rail GND2. As a result, decoupling capacitor 116A coupled between supply rail VDD1 and ground rail GND1 may be effective during the second mode to create a low-impedance path from supply rail VDD1 to ground rail GND2. In particular, ground rail GND1 may provide a return path for high-frequency current components flowing through one-time programmable memory 208.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a first power domain defined by a first supply rail and a first ground rail;
   a second power domain defined by a second supply rail and a second ground rail; and
   a configurable switch coupled between the first ground rail and the second ground rail such that:
   when the configurable switch is enabled, the first ground rail and the second ground rail are electrically shorted to one another; and
   when the configurable switch is disabled, the first ground rail and the second ground rail are electrically isolated from one another, wherein a first impedance between the first supply rail and the first ground rail is lower than a second impedance between the first supply rail and the second ground rail when the configurable switch is disabled.

2. The system of claim 1, wherein the second impedance decreases when the configurable switch is enabled.

3. The system of claim 1, wherein the configurable switch is a field-effect transistor.

4. The system of claim 1, wherein the system is implemented within a single integrated circuit.

5. The system of claim 1, wherein:
   when the configurable switch is enabled, the impedance between the first supply rail and the second ground rail is overdamped; and
   when the configurable switch is disabled, the impedance between the first supply rail and the second ground rail is underdamped.

6. A system comprising:
   a first power domain defined by a first supply rail and a first ground rail;
   a second power domain defined by a second supply rail and a second ground rail; and
   a configurable switch coupled between the first ground rail and the second ground rail such that:
   when the configurable switch is enabled, the first ground rail and the second ground rail are electrically shorted to one another;
   when the configurable switch is disabled, the first ground rail and the second ground rail are electrically isolated from one another; and
   a load that is powered from the second supply rail with the second ground rail as a current return path in a first mode when the configurable switch is disabled and powered from the first supply rail with the first ground rail and the second ground rail as the current return path in a second mode when the configurable switch is enabled.

7. The system of claim 6, wherein the load comprises a one-time programmable memory.

8. The system of claim 6, wherein a first voltage of the first supply rail is greater than a second voltage of the second supply rail.

9. The system of claim 6, wherein the configurable switch is a field-effect transistor.

10. The system of claim 6, wherein the system is implemented within a single integrated circuit.

11. The system of claim 6, wherein:
    when the configurable switch is enabled, the impedance between the first supply rail and the second ground rail is overdamped; and
    when the configurable switch is disabled, the impedance between the first supply rail and the second ground rail is underdamped.

12. A method comprising, in a system having a first power domain defined by a first supply rail and a first ground rail and a second power domain defined by a second supply rail and a second ground rail:
    in a first mode, disabling a configurable switch coupled between the first ground rail and the second ground rail in order to electrically isolate the first ground rail and the second ground rail from one another; and
    in a second mode, enabling the configurable switch in order to electrically short the first ground rail and the second ground rail to one another, wherein a first impedance between the first supply rail and the first ground rail is lower than a second impedance between the first supply rail and the second ground rail when the configurable switch is disabled.

13. The method of claim 12, wherein the second impedance decreases when the configurable switch is enabled.

14. The method of claim 12, wherein the configurable switch is a field-effect transistor.

15. The method of claim 12, wherein the system is implemented within a single integrated circuit.

16. The method of claim 12, wherein:
    when the configurable switch is enabled, the impedance between the first supply rail and the second ground rail is overdamped; and
    when the configurable switch is disabled, the impedance between the first supply rail and the second ground rail is underdamped.

17. A method comprising, in a system having a first power domain defined by a first supply rail and a first ground rail and a second power domain defined by a second supply rail and a second ground rail:
- in a first mode, disabling a configurable switch coupled between the first ground rail and the second ground rail in order to electrically isolate the first ground rail and the second ground rail from one another; and
- in a second mode, enabling the configurable switch in order to electrically short the first ground rail and the second ground rail to one another;
- wherein a load of the system is powered from the second supply rail with the second ground rail as a current return path in the first mode and powered from the first supply rail with the first ground rail and the second ground rail as the current return path in the second mode.

18. The method of claim 17, wherein the load comprises a one-time programmable memory.

19. The method of claim 17, wherein a first voltage of the first supply rail is greater than a second voltage of the second supply rail.

20. The method of claim 17, wherein the configurable switch is a field-effect transistor.

21. The method of claim 17, wherein the system is implemented within a single integrated circuit.

22. The method of claim 17, wherein:
- when the configurable switch is enabled, the impedance between the first supply rail and the second ground rail is overdamped; and
- when the configurable switch is disabled, the impedance between the first supply rail and the second ground rail is underdamped.

* * * * *